United States Patent [19]

Kumpfmueller et al.

[11] Patent Number: 4,965,696
[45] Date of Patent: Oct. 23, 1990

[54] VOLTAGE DOUBLING DRIVING CIRCUIT FOR CONTROLLING A FIELD EFFECT TRANSISTOR HAVING A SOURCE LOAD

[75] Inventors: Hans-Georg Kumpfmueller, Donaustauf; Joachim Schaefer, Straubing-Kagers, both of Fed. Rep. of Germany

[73] Assignee: Siemens Aktiengesellschaft, Berlin and Munich, Fed. Rep. of Germany

[21] Appl. No.: 425,573

[22] Filed: Oct. 23, 1989

[30] Foreign Application Priority Data

Oct. 27, 1988 [EP] European Pat. Off. ........ 88117942.8

[51] Int. Cl.$^5$ .......................................... H01H 47/00
[52] U.S. Cl. .................................. 361/160; 307/482; 307/571; 307/578; 323/351; 363/60
[58] Field of Search ............... 323/282, 351; 307/571, 307/482, 578, 579; 361/160, 152; 363/60

[56] References Cited

U.S. PATENT DOCUMENTS

| | | | |
|---|---|---|---|
| 3,866,060 | 2/1975 | Bannister et al. | 307/43 |
| 4,420,700 | 12/1983 | Fay et al. | 323/351 |
| 4,599,555 | 7/1986 | Damiano et al. | 323/351 |
| 4,733,159 | 3/1988 | Edwards et al. | 323/282 |
| 4,737,667 | 4/1988 | Tihanyi | 307/578 |
| 4,796,174 | 1/1989 | Nadd | 363/60 |

FOREIGN PATENT DOCUMENTS

| | | |
|---|---|---|
| 0229482 | 7/1987 | European Pat. Off. . |
| 0236967 | 9/1987 | European Pat. Off. . |
| 182913 | 7/1988 | Japan ................ 307/482 |
| 1323 | 1/1989 | Japan ................ 307/578 |

OTHER PUBLICATIONS

New Electronics, Jun. 25, 1985, No. 13, London, Great Britain, p. 25.

Primary Examiner—William H. Beha, Jr.
Attorney, Agent, or Firm—Hill, Van Santen, Steadman & Simpson

[57] ABSTRACT

An output stage having a load is connected to a voltage source via a source-drain path of a field effect transistor. Between drain and gate terminals of the field effect transistor a specifically designed voltage doubling circuit is provided. This has the effect that only one control voltage and one switch (control transistor T1) is required for driving the field effect transistor.

7 Claims, 1 Drawing Sheet

VOLTAGE DOUBLING DRIVING CIRCUIT FOR CONTROLLING A FIELD EFFECT TRANSISTOR HAVING A SOURCE LOAD

BACKGROUND OF THE INVENTION

The invention refers to a power output stage with a load. The load is connected to a constant voltage source via a source-drain path of a field effect transistor (FET). See, for example, European Patent EP-A 0 236 1967, incorporated herein by reference.

If the field effect transistor is to be switched on, the potential at its gate terminal must be higher by a certain voltage than at its drain terminal.

The known circuit arrangement comprises a FET, whose sourcedrain path lies at a voltage source (circuit operating voltage) in line or in series with a load to be switched. One terminal of a capacitor is connected to a voltage source (charge circuit) via a diode, and to the gate terminal of the FET (control circuit) via another diode, whereby respectively one switch is arranged between the two diodes and the voltage source. The other terminal of the capacitor is supplied with a clocked dc voltage, if the FET is to be switched on. Simultaneously, the one switch must be closed and the other opened.

SUMMARY OF THE INVENTION

It is an object of the present invention to simplify a circuit arrangement of the above described type.

According to the invention, a voltage doubling circuit is provided for driving the gate of the FET which controls current flow to the load. A control voltage is fed to a control input of a switch connected between the gate of the FET and a reference potential. Between a voltage source supplying the FET and reference potential, a series circuit is provided formed of the control transistor, a first diode, a charging capacitor, and a second diode. A first resistor is connected in parallel to the series connection of the second diode and capacitor. A second resistor is connected in parallel to the series connection of the capacitor and first diode.

One special advantage of the invention compared to the known circuit arrangement is that, instead of two switches and three different control voltages, only one switch and one control voltage is required.

DESCRIPTION OF THE PREFERRED EMBODIMENTS

Figure 1:
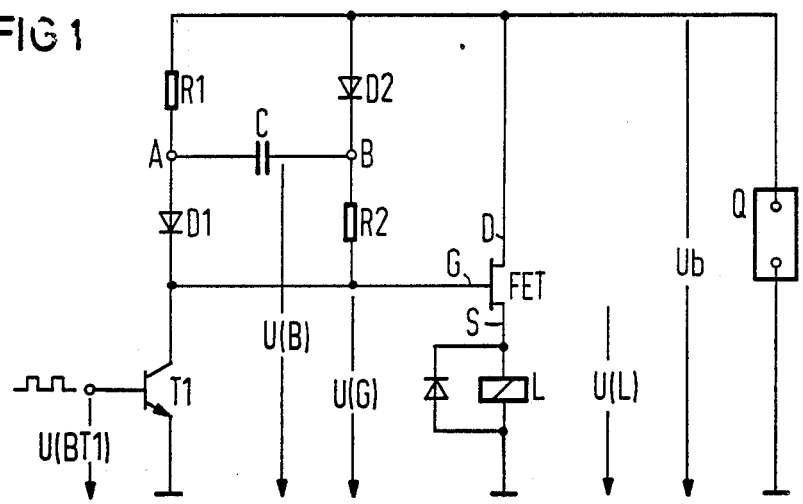
FIG. 1 is a schematic diagram of a circuit arrangement of an embodiment of the invention wherein a power output stage with an inductive load is depicted.

The load L in FIG. 1 is illustrated as an exciting winding or field coil of a relay with an unloading diode connected in parallel fashion thereacross. This load L is connected to a voltage source Q (circuit operating voltage) via the source-drain path of a field effect transistor. The FET can be a power-MOS-transistor, for example. The gate terminal G of the FET is connected with the collector of a control transistor T1, whose emitter lies at ground (the negative pole of the voltage source) and at whose base a control voltage U(BT1) can be fed.

Between the positive pole of the voltage source and the drain terminal D on the one hand, and the gate terminal G on the other hand, a circuit of five components is inserted. Between the voltage source Q and a first connecting point A a first resistor R1 is provided. Between the first connecting point A and the gate terminal G, a first diode D1 is provided in a conducting direction toward the gate terminal G. From the voltage source Q to a second connecting point B, a second diode D2 is provided in a conducting direction. Between the second connecting point B and the gate terminal G, a second resistor R2 is provided. Between the two connecting points A and B, a capacitor C is provided.

In the quiescent condition, the circuit arrangement is connected to the voltage source Q. At the base of the control transistor T1, a constant dc voltage U(BT1)=1 Volt is present for controlling the transistor.

The gate terminal G and the connecting point A almost lie at ground potential. The connecting point B, however, is almost at the potential Ub of the voltage source Q. The capacitor C is thus charged up.

Since the gate terminal G almost lies at ground potential, the FET is blocked, and voltage U(L) and current i(L) at the load are zero.

Figure 2:
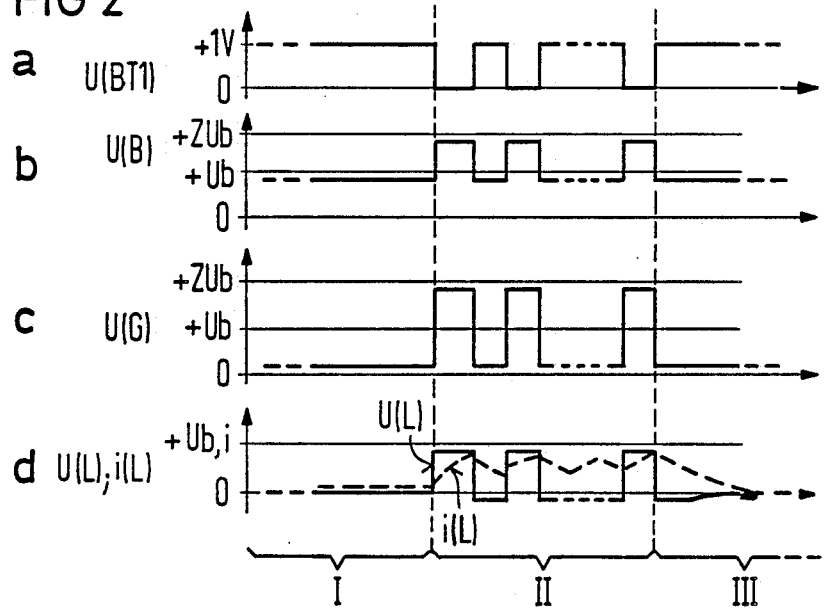
FIG. 2 shows chronological waveforms of
 (a) the control voltage U(BT1),
 (b) the voltage U(B) at the connecting point B,
 (c) the voltage U(G) at the gate terminal G, and
 (d) the voltage U(L) and current i(L) at the load L.

If the load L is to be connected with the voltage source Q (section II in FIG. 2), a clocked dc voltage must be fed at the base of the control transistor T1 as a control signal U(BT1) whose amplitude alternates periodically between the values 1 V and 0 V (FIG. 2a, section II).

With the interpulse period of the control signal U(BT1) the control transistor T1 goes into the non-conducting condition, and the voltage at the connecting point A jumps to the value +Ub. The voltage U(B) at the connecting point B jumps to almost +2Ub (FIG. 2b) by the same amount. This voltage value is transferred to the gate terminal G (FIG. 2c) and the FET changes over into the conducting condition. The control circuit is composed of the voltage source, the two resistors R1 and R2, the capacitor C, the gate-source path of the FET, and the load L. At the load L the voltage U(L) is present, which is lower than the voltage +Ub of the voltage source by merely the low voltage drop at the FET (FIG. 2d). As a consequence, there is a rapidly increasing load current i(L) (dashed line in FIG. 2d).

With the next impulse of the control voltage U(BT1), the control transistor T1 becomes conductive again, the gate terminal G is connected to ground, the FET blocks, and the voltage U(L) nearly becomes zero and the load current i(L) becomes smaller. The potential at the connecting point A nearly drops to ground potential, and the potential at the connecting point B is reduced by the same amount. A current flows again through the capacitor C, whereby this capacitor is re-charged. With the next interpulse period of the control signal U(BT1), the events repeat themselves as described earlier.

These events (FIG. 2a to d, section II) repeat themselves as long as the clocked dc voltage is present at the control transistor T1 as control signal U(BT1). After switching the control signal U(BT1) to the constant dc voltage U(BT1)=1V, the circuit arrangement returns into the quiescent condition (FIG. 2a to d, section III).

Although various minor changes and modifications might be proposed by those skilled in the art, it will be understood that we wish to include within the claims of the patent warranted hereon all such changes and modifications as reasonably come within our contribution to the art.

WE CLAIM AS OUR INVENTION:

1. An output stage, comprising:
   a voltage source providing an operating voltage with respect to a reference potential;
   a series circuit connected between the operating voltage and the reference potential comprising a source-drain path of a field effect transistor and a load;
   an electronic switch having a control input, said electronic switch being connected between a gate of the field effect transistor and the reference potential; and
   a voltage doubling circuit comprising a series connection of a first diode, a capacitor, and a second diode between the operating voltage and said switch, and wherein a first resistor is connected in parallel to the series connection of the second diode and capacitor, and a second resistor is connected in parallel to the series connection of the capacitor and first diode.

2. An output stage according to claim 1 wherein the first and second diodes are arranged in a conducting direction from the operating voltage to the switch.

3. An output stage according to claim 1 wherein a control voltage is connected to said control input which comprises a voltage which, in a quiescent condition of the output stage, is at a first logic level, and when current is to flow through the load, the control voltage comprises a clock voltage changing between the first logic level and a second logic level.

4. An output stage according to claim 1 wherein a diode is connected in parallel to the load.

5. An output stage according to claim 1 wherein the load comprises an inductance.

6. An output stage according to claim 5 wherein the load is a coil of a relay.

7. An output stage according to claim 1 wherein the switch comprises a transistor whose emitter is connected to the reference potential, whose collector connects to the gate of the field effect transistor, and whose base comprises said control input.

* * * * *